United States Patent [19]

Sugiura

[11] Patent Number: 5,481,190
[45] Date of Patent: Jan. 2, 1996

[54] MRI AUTO POWER CONTROL METHOD AND SYSTEM

[75] Inventor: Satoshi Sugiura, Ootawara, Japan

[73] Assignee: Kabushiki Kaisha Toshiba, Kawasaki, Japan

[21] Appl. No.: 354,473

[22] Filed: Dec. 12, 1994

Related U.S. Application Data

[63] Continuation-in-part of Ser. No. 914,797, Jul. 16, 1992, abandoned.

[30] Foreign Application Priority Data

Jul. 19, 1991 [JP] Japan .................................. 3-179850

[51] Int. Cl.⁶ ............................................... G01V 3/00
[52] U.S. Cl. .......................................... 324/314; 324/307
[58] Field of Search ................................... 324/300, 307, 324/308, 309, 312, 314, 318, 322

[56] References Cited

U.S. PATENT DOCUMENTS

| | | | |
|---|---|---|---|
| 4,675,608 | 1/1987 | Hanawa et al. ........................... | 324/314 |
| 4,739,267 | 4/1988 | Leroux et al. ............................ | 324/314 |
| 4,806,867 | 2/1989 | Hanawa et al. ........................... | 324/314 |
| 4,866,386 | 9/1989 | Sattin ...................................... | 324/314 |
| 4,983,921 | 1/1991 | Kramer et al. ........................... | 324/309 |

FOREIGN PATENT DOCUMENTS

| | | | |
|---|---|---|---|
| 0242286A1 | 10/1987 | European Pat. Off. ........ | G01N 24/08 |
| 0391279A2 | 10/1990 | European Pat. Off. ........ | G01R 33/46 |
| 0463789A2 | 1/1991 | European Pat. Off. ........ | G01R 33/54 |
| 0414474A2 | 2/1991 | European Pat. Off. ........ | G01R 33/54 |
| 0439119A2 | 7/1991 | European Pat. Off. ........ | G01R 33/54 |

OTHER PUBLICATIONS

Operation Manual, V2.0 by Diasonics MT/S, Revision A, "Image Acquisition" (date unknown).
Operator Manual, Vol. 3, "Patient Preparation and the MR Exam" G. E. Oct. 1984.
Patent Application Serial No. 907,519 "Automatic Transmit and Receive Attenuation Prescaling in Nuclear Magnetic Resonance Scanner".

Primary Examiner—Louis M. Arana
Attorney, Agent, or Firm—Ronald L. Yin; Limbach & Limbach

[57] ABSTRACT

An MRI automatic power control system comprises a first unit for exciting each of a plurality of regions of a subject under examination with an excitation radio-frequency pulse of a different power, a second unit for acquiring magnetic resonance signals from the plurality of regions excited by the first unit, a third unit for identifying a maximum magnetic resonance signal contained in the magnetic resonance signals acquired by the second unit from the plurality of regions of the subject, and a fourth unit for storing the power of an excitation radio-frequency pulse that has provided the maximum magnetic resonance signal identified by the third unit as the optimum power of the excitation radio-frequency pulses.

12 Claims, 7 Drawing Sheets

MRI AUTO POWER CONTROL METHOD AND SYSTEM

This is a continuation-in-part of application Ser. No. 07/914,797 filed on Jul. 16, 1992 now abandoned.

BACKGROUND OF THE INVENTION

1. Field of the Invention

The present invention relates to an MRI auto power control method and system for selecting the optimum power of excitation radio-frequency pulses.

2. Description of the Related Art

The magnetic resonance is a phenomenon in which atomic nuclei having non-zero spins and magnetic moments and placed in a static magnetic field absorb and radiate electromagnetic energy at specific (resonant) frequencies. The atomic nuclei are resonant at an angular frequency $\omega o$ ($=2\pi\nu o$, $\nu$ is the Larmor frequency) given by $$\omega o = \gamma Ho$$

where $\gamma$ is the gyromagnetic ratio inherent in each type of nucleus and Ho is the strength of the applied static magnetic field.

Apparatus for making in vivo diagnosis utilizing the above nuclear magnetic resonance phenomenon processes electromagnetic signals of the same frequency as above induced after resonance absorption to obtain diagnostic information, on a noninvasive basis, in which magnetic resonance parameters, such as atomic nuclear density, longitudinal relaxation time T1, transverse relaxation time T2, flow, chemical shift, etc., are reflected, for example, a cross-sectional image of a selected slice of a human body under examination.

In principle, magnetic resonance diagnostic information can be acquired from the whole body of a patient placed in a static magnetic field. However, constraints on the configuration of apparatus and clinical requirements for diagnostic images allow actual apparatus to excite a selected body portion of a patient and acquire diagnostic information therefrom.

In general, a slice of a body having a certain thickness is selected to be a candidate for imaging. A cross-sectional magnetic resonance (MR) image of the selected slice is produced by performing a data encoding process many times to acquire MR signals, such as echo signals or FID (free induction decay) signals, from the slice and then performing an image reconstruction process based on, for example, two-dimensional Fourier transformation on the MR signals.

Some conventional magnetic resonance imaging (MRI) apparatuses are equipped with an automatic power control (APC) system. The APC is adapted to automatically set the strength of excitation RF pulses at an optimum value. This type of APC has been described and disclosed in Japanese Unexamined Patent Publication No. 61-191946 (laid open on Aug. 26, 1986), U.S. Pat. Nos. 4,806,867 and 4,675,608.

Figure 1:
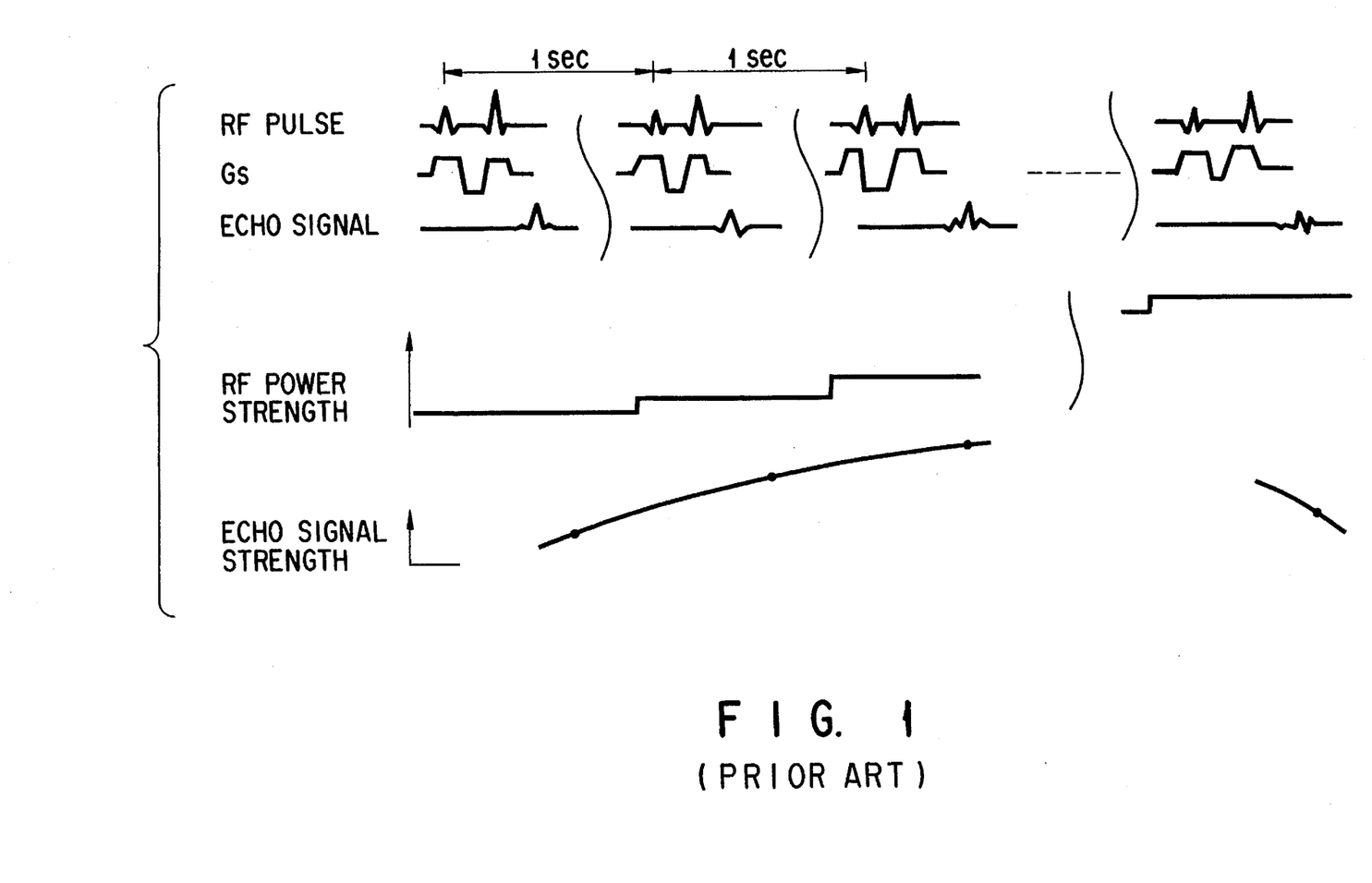
FIG. 1 is a schematic illustration of prior art MRI automatic power control.

The prior art APC system will be described with reference to FIG. 1. That is, RF pulses (excitation radio-frequency pulses), having their strength varied in steps by varying the attenuation factor of an attenuator, and a slice-selection gradient magnetic field Gs are applied to a slice in a region of interest at preselected pulse repetition intervals, thereby acquiring echo signals from the slice as an MR signal. The RF pulse strength when the maximum MR signal is obtained is identified as the optimum RF pulse strength for that slice. The RF pulse strength determines the flip angles of spins which have a great effect upon image quality. The slice is scanned with RF pulses having the optimum strength. This technique is based on the fact that optimum RF pulse strength varies with regions of a human body and permits optimum MR diagnostic information to be obtained from any region of a human body.

However, a magnetic resonance imaging apparatus equipped with such a conventional APC means has the following problem. That is, in the process of MR signal acquisition with the RF pulse strength varied, in order to, after acquisition of an MR signal by the use of an RF pulse of a certain strength, acquire another MR signal by the use of another RF pulse of a different strength, it is necessary to wait for the longitudinal relaxation of spins once excited. This makes it impossible to shorten the signal acquisition cycle (pulse repetition interval) extremely. The pulse repetition time is generally one second or more. Even if a curve fitting technique is used to decrease the number of measured points, several seconds to tens of seconds will be required to finish all of processes.

SUMMARY OF THE INVENTION

It is therefore an object of the present invention to provide an MRI automatic power control method which permits optimum power of excitation radio-frequency pulses to be determined in a short time.

According to a first aspect of the present invention, there is provided an MRI automatic power control method comprising:

a first step of exciting each of a plurality of regions of a subject under examination with an excitation radio-frequency pulse of a different power;

a second step of acquiring magnetic resonance signals from said plurality of regions excited by said first step;

a third step of identifying a maximum magnetic resonance signal contained in said magnetic resonance signals acquired by said second step from said plurality of regions of said subject; and a fourth step of storing the power of an excitation radio-frequency pulse that has provided said maximum magnetic resonance signal identified by said third step as the optimum power of said excitation radio-frequency pulses.

According to a second aspect of the present invention, there is provided an MRI automatic power control method comprising:

a first step of exciting each of a plurality of regions of a subject under examination with an excitation radio-frequency pulse of a different power;

a second step of acquiring magnetic resonance signals from said plurality of regions excited by said first step;

a third step of exciting said plurality of regions of said subject with excitation radio-frequency pulses of an equal power;

a fourth step of acquiring magnetic resonance signals from said plurality of regions of said subject excited by said third step;

a fifth step of correcting said magnetic resonance signals acquired by said second step using said magnetic resonance signals acquired by said fourth step for each of said plurality of regions;

a sixth step of identifying a maximum corrected magnetic resonance signal contained in said magnetic resonance signals corrected by said fifth step for each of said plurality of regions; and a seventh step of storing the power of an excitation radio-frequency pulse that has provided said maximum corrected magnetic resonance signal identified by said sixth step as the optimum power of said excitation radio-frequency pulses.

According to a third aspect of the present invention, there is provided an MRI automatic power control system comprising:

first means for exciting each of a plurality of regions of a subject under examination with an excitation radio-frequency pulse of a different power;

second means for acquiring magnetic resonance signals from said plurality of regions excited by said first means;

third means for identifying a maximum magnetic resonance signal contained in said magnetic resonance signals acquired by said second means from said plurality of regions of said subject; and fourth means for storing the power of an excitation radio-frequency pulse that has provided said maximum magnetic resonance signal identified by said third means as the optimum power of said excitation radio-frequency pulses.

According to a fourth aspect of the present invention, there is provided an MRI automatic power control system comprising:

first means for exciting each of a plurality of regions of a subject under examination with an excitation radio-frequency pulse of a different power;

second means for acquiring magnetic resonance signals from said plurality of regions excited by said first means;

third means for exciting said plurality of regions of said subject with excitation radio-frequency pulses of an equal power;

fourth means for acquiring magnetic resonance signals from said plurality of regions of said subject excited by said third means;

fifth means for correcting said magnetic resonance signals acquired by said second means using said magnetic resonance signals acquired by said fourth means for each of said plurality of regions;

sixth means for identifying a maximum corrected magnetic resonance signal contained in said magnetic resonance signals corrected by said fifth means for each of said plurality of regions; and seventh means for storing the power of an excitation radio-frequency pulse that has provided said maximum corrected magnetic resonance signal identified by said sixth means as the optimum power of said excitation radio-frequency pulses.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 2:
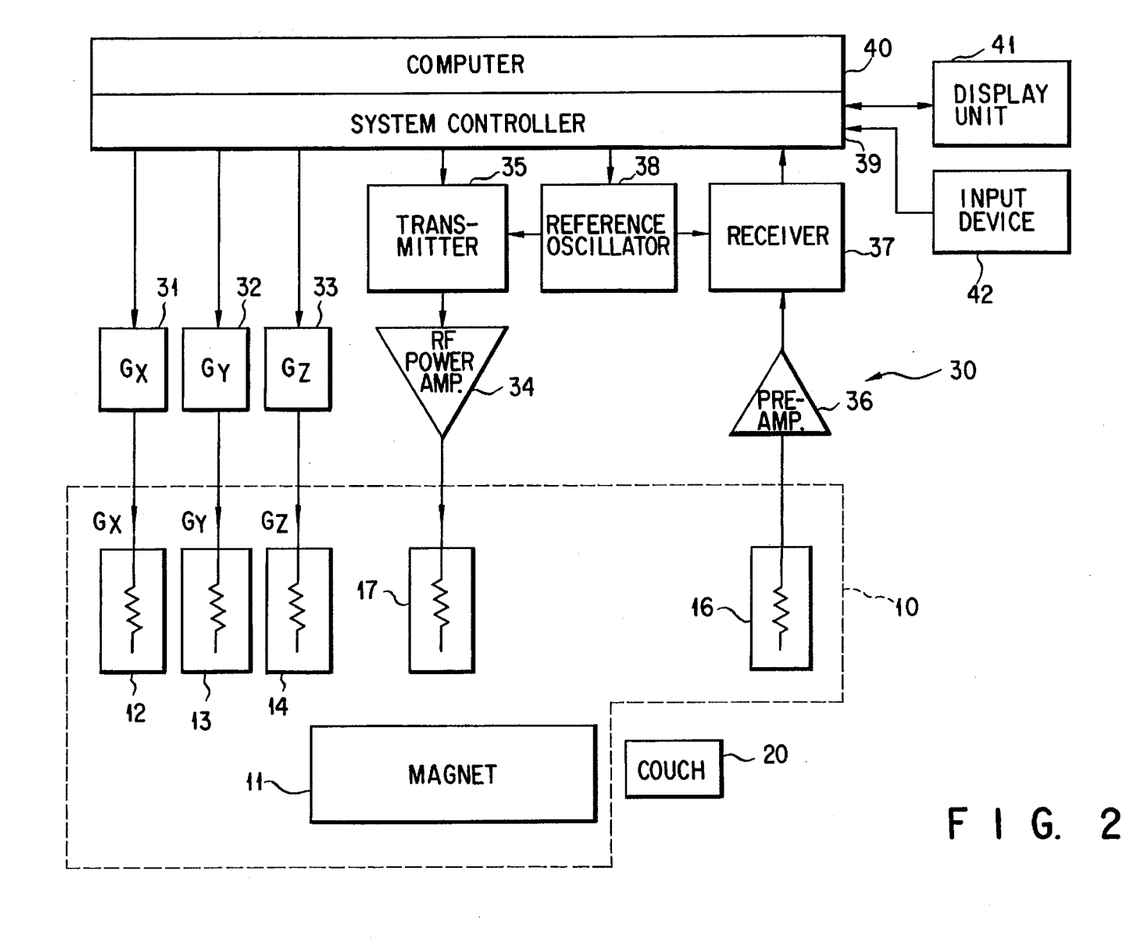
FIG. 2 is a schematic diagram of a magnetic resonance imaging apparatus into which an MRI automatic power control system according to the present invention is incorporated.

Referring now to FIG. 2, a magnetic resonance imaging apparatus of the present invention comprises a magnet system 10, an examination couch 20 on which a patient is laid, and an electric system 30. The electric system includes an MRI automatic power control system according to the present invention.

The magnet system 10 comprises a magnet 11 for forming a static magnetic field, such as a superconducting magnet, a non-superconducting magnet or a permanent magnet, an X-axis magnetic field gradient forming coil 12 for forming a gradient magnetic field in the X-axis direction, a Y-axis gradient field forming coil 13 for forming a gradient magnetic field in the Y-axis direction, a Z-axis gradient field forming coil 14 for forming a gradient magnetic field in the Z-axis direction, a transmitter coil 15 for applying an excitation radio-frequency pulsed magnetic field (RF pulse), and a receiver coil 16 for receiving a magnetic resonance signal (an echo signal) from a human body under examination. Though not shown, space is formed within the magnet system 10 to accommodate a human body. Further, the static magnetic field, the gradient magnetic fields and the RF pulsed magnetic field can be formed within the space, whereby the composite magnetic field is applied to the human body and echo signals induced in the human body can be acquired.

The human body is laid on the couch 20 and allowed to have access to the space within the magnet system 10.

The electric system 30 comprises an X-axis gradient magnetic field amplifier 31 for the X-axis gradient field coil 12, a Y-axis gradient field amplifier 32 for the Y-axis gradient field coil 13, a Z-axis gradient field amplifier 33 for the Z-axis gradient field coil 14, a transmitter 35 for producing an RF signal to be applied to an RF power amplifier 34, a preamplifier 36 for amplifying an echo signal received by the receiver coil 16, a receiver 37 for detecting the echo signal amplified by the preamplifier 36, a reference signal oscillator 38 for providing a reference signal to the transmitter 36 and the receiver 37, a system controller 39 for controlling the gradient field amplifiers 31, 32 and 33, the transmitter 35, the receiver 37, and the reference signal oscillator 38, a computer 40 for controlling the system controller 39 and producing image information on the basis of data obtained by the receiver 37, a display unit connected to the system controller for visually displaying the image information, and an input unit 42 for inputting imaging diagnosis conditions such as pulse sequence, etc. The components of the electric system 30 construct the MRI automatic power control system according to the present invention.

Figure 3:
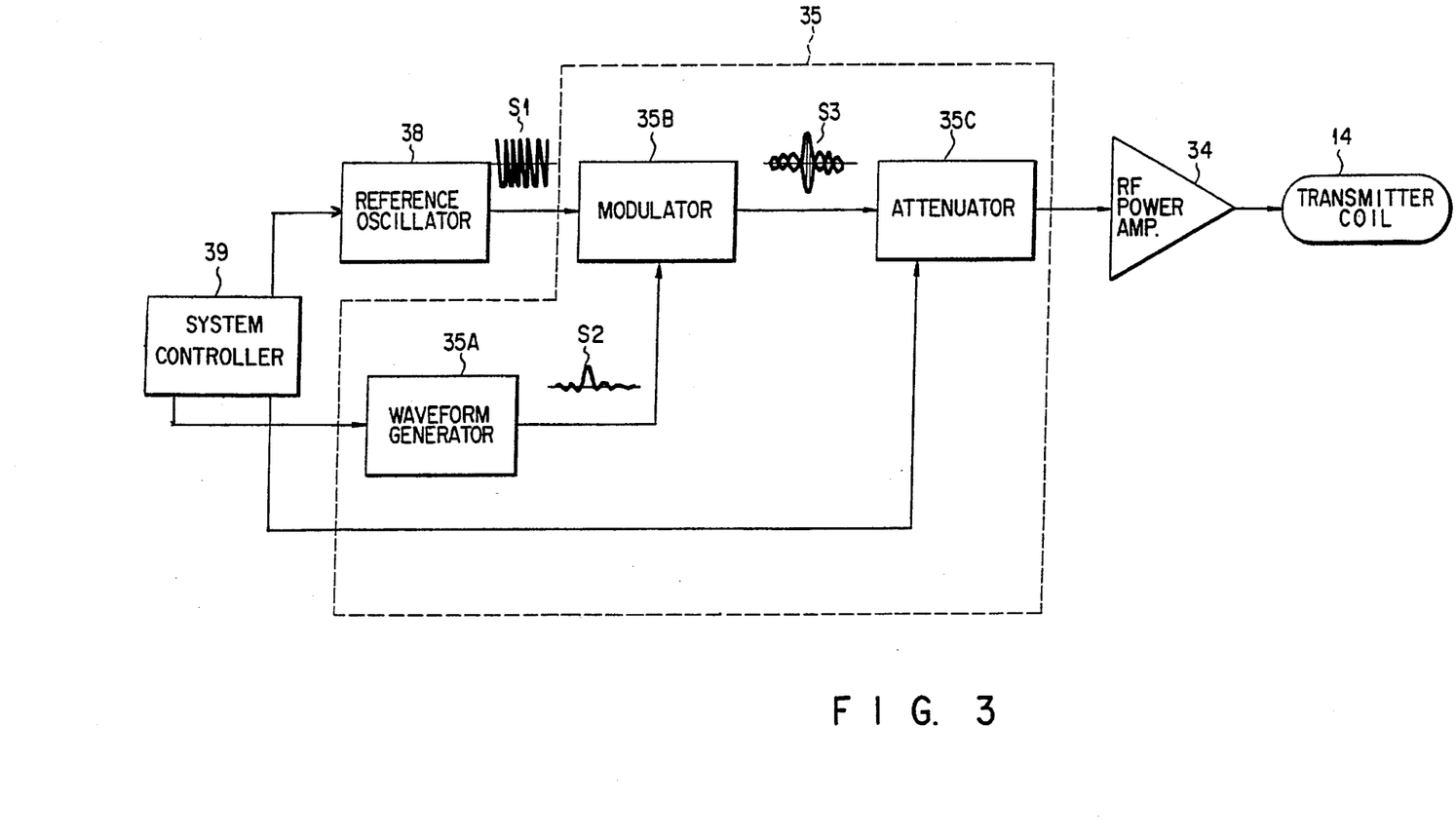
FIG. 3 is a detailed block diagram of the transmitting section of FIG. 2.

Next, the transmitter 35 will be described in detail with reference to FIG. 3. As shown, the transmitter 35 comprises a waveform generator 35A, a modulator 35B, and an attenuator 35C. The reference signal generator 38 generates a reference signal S1 under the control of the system controller 39. The waveform generator 35A of the transmitter 35 generates a predetermined waveform S2, such as an SINC function waveform, etc., under the control of the system controller 39. The modulator 35B modulates the reference signal S1 with the waveform S2, thereby obtaining a modulated wave. The attenuator 35C attenuates the modulated wave under the control of the system controller 39, feeding the attenuated modulated wave to the RF power amplifier 34. The RF power amplifier 34 amplifies the attenuated modulated wave, feeding the amplified waveform to the transmitter coil 14. As a result, an RF pulsed magnetic field is generated from the transmitter coil 14.

Figure 4:
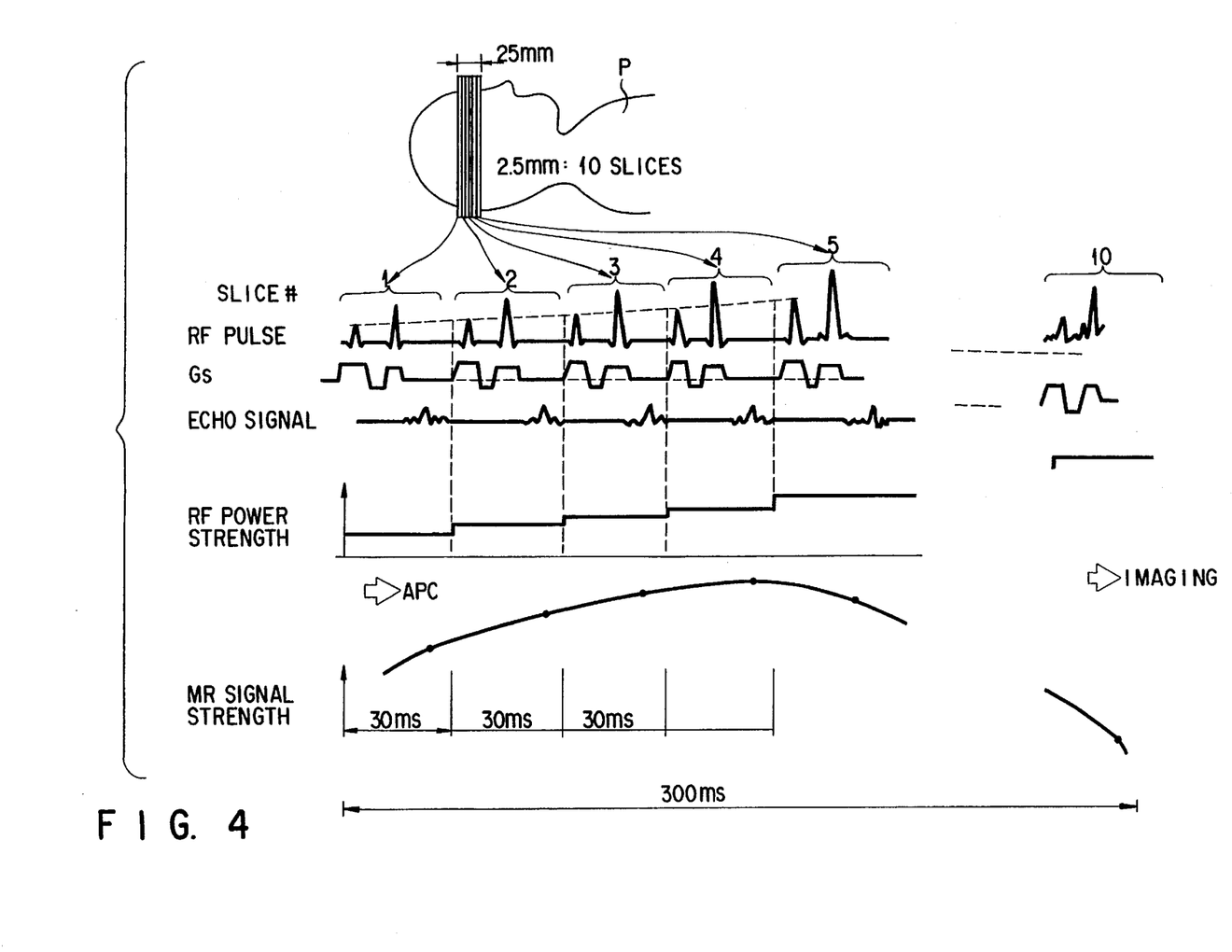
FIG. 4 is a diagram illustrating a first embodiment of the MRI automatic power control method and system of the present invention.

The point of the present embodiment will be described here. The present embodiment is characterized by software used in the system controller 39. This is indicated by a first example shown in FIGS. 4 and 5 and by a second example shown in FIGS. 6 and 7. Hereinafter, the first example will be described with reference to FIGS. 4 and 5, and the second embodiment will be described with reference to FIGS. 6 and 7. The first example is directed to APC in which a plurality of neighboring planar slices of a human body are excited in sequence, echo signals are acquired while excitation radio-frequency pulses are applied to the human body with their strength varied, so as to perform the excitation of the slices before passing relaxation time (longitudinal relaxation time) $T_1$ of the slices and the strength of an excitation radio-frequency pulse that provides a maximum magnetic resonance signal is identified as the optimum pulse strength for that region. As shown in FIG. 4, in order to selectively excite ten planar slices, each having a thickness of 2.5 mm, of a human body P, RF pulses and slice-selection gradient magnetic fields are applied to the human body, so as to perform the excitation of the slices before passing relaxation time (longitudinal relaxation time) $T_1$ of the slices. In this case, the RF-pulse strength is varied for each slice, for example, in steps. An MR signal (echo signal) is acquired for each slice (at each RF pulse) in steps 100 and 102. An MR signal at maximum is identified in step 104. The strength of an RF pulse that provides the maximum MR signal is stored as the optimum RF pulse strength for the excitation region in this example in a memory of the system controller 39 or the computer 40 (step 106). In imaging the excitation region in this example, RF pulses are applied to the human body with their strength set to the optimum strength.

Figure 5:
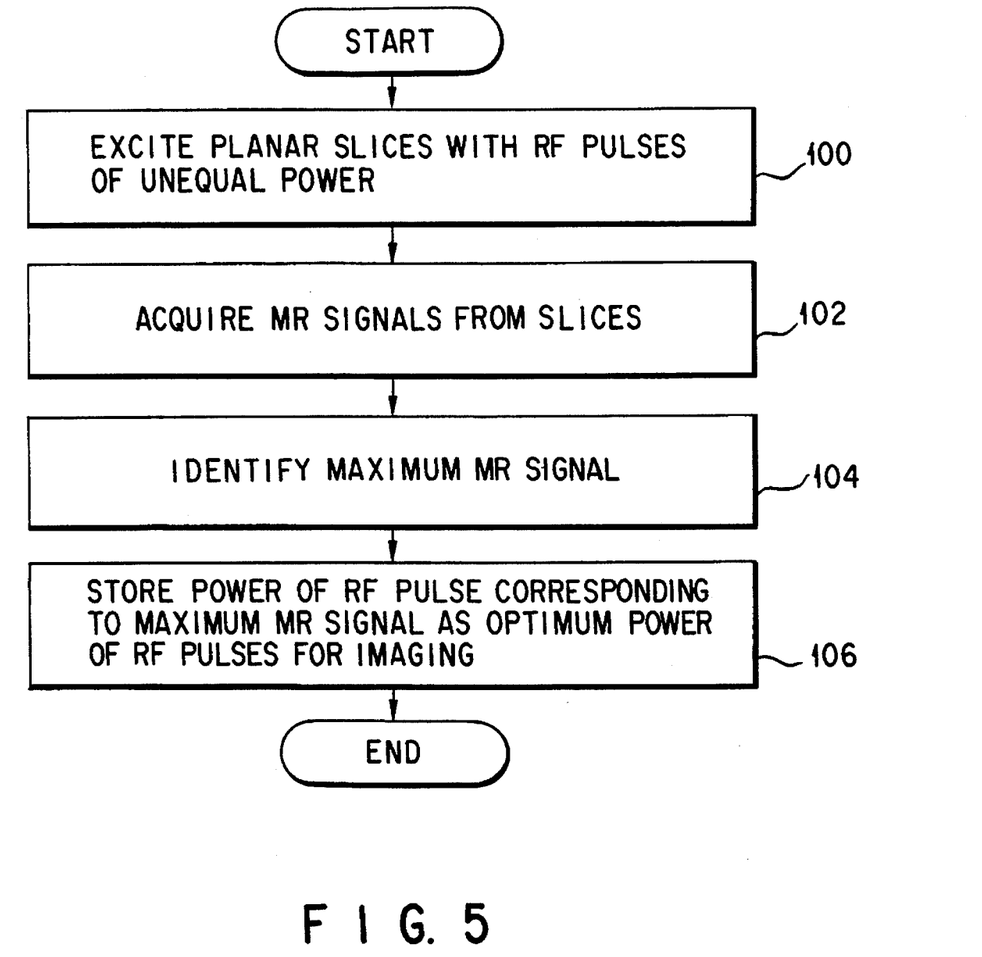
FIG. 5 is a flowchart illustrating the MRI automatic power control shown in FIG. 4.

Assuming the time required to acquire data from each slice to be 30 msec, the APC in this example will be completed in 300 msec. In order to avoid interference in magnetic resonance phenomenon between neighboring slices, and, preferably, in order not to excite neighboring slices continuously, it will be needed to use a technique.

The above-described first example is based on the assumptions that, since MR signals from different slices are compared, the neighboring slices are substantially equal in property (structure) to one another, and there is little difference in quantity of protons among the slices.

Figure 6:
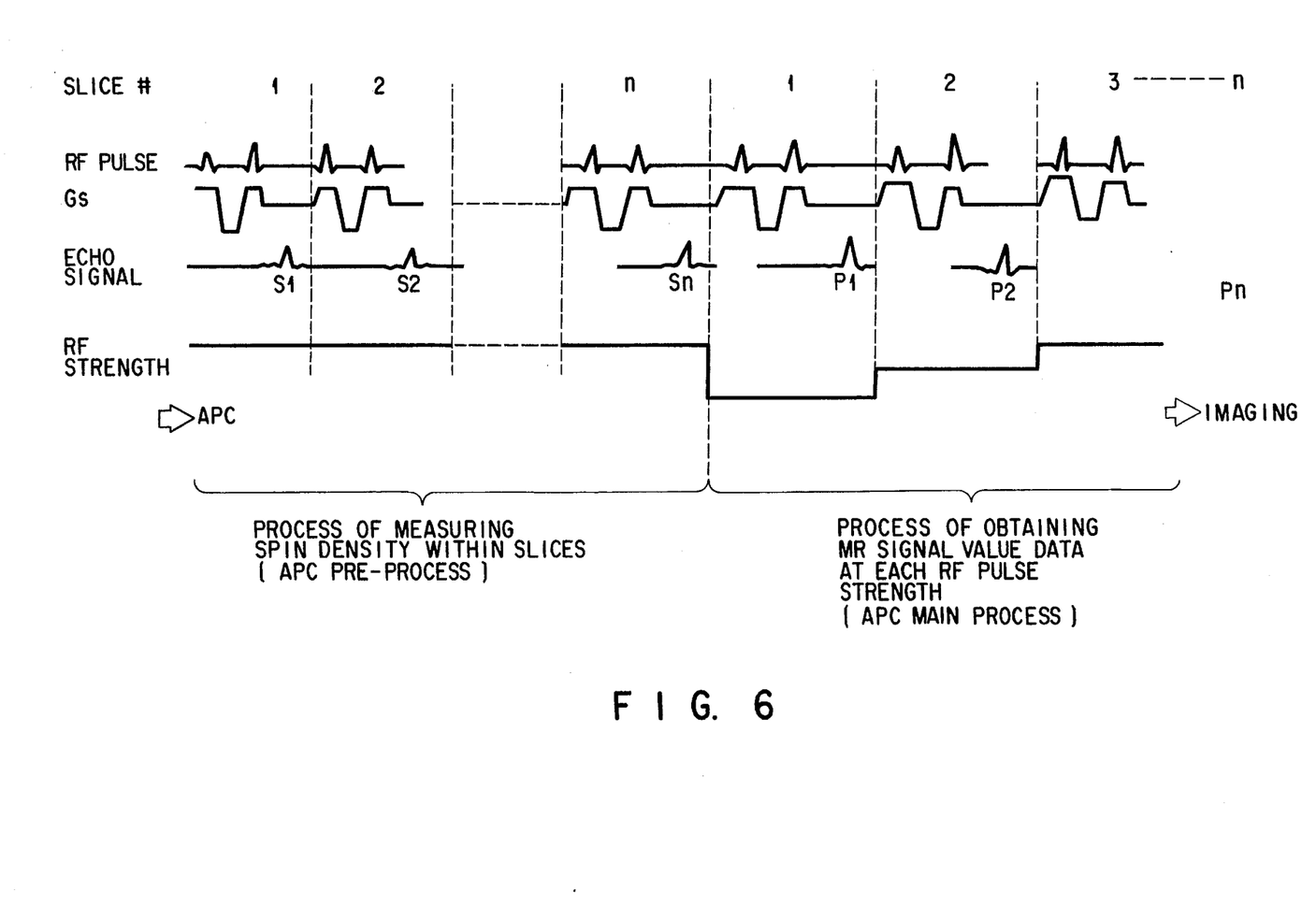
FIG. 6 is a diagram illustrating a second embodiment of the MRI automatic power control method and system according to the present invention.
Figure 7:
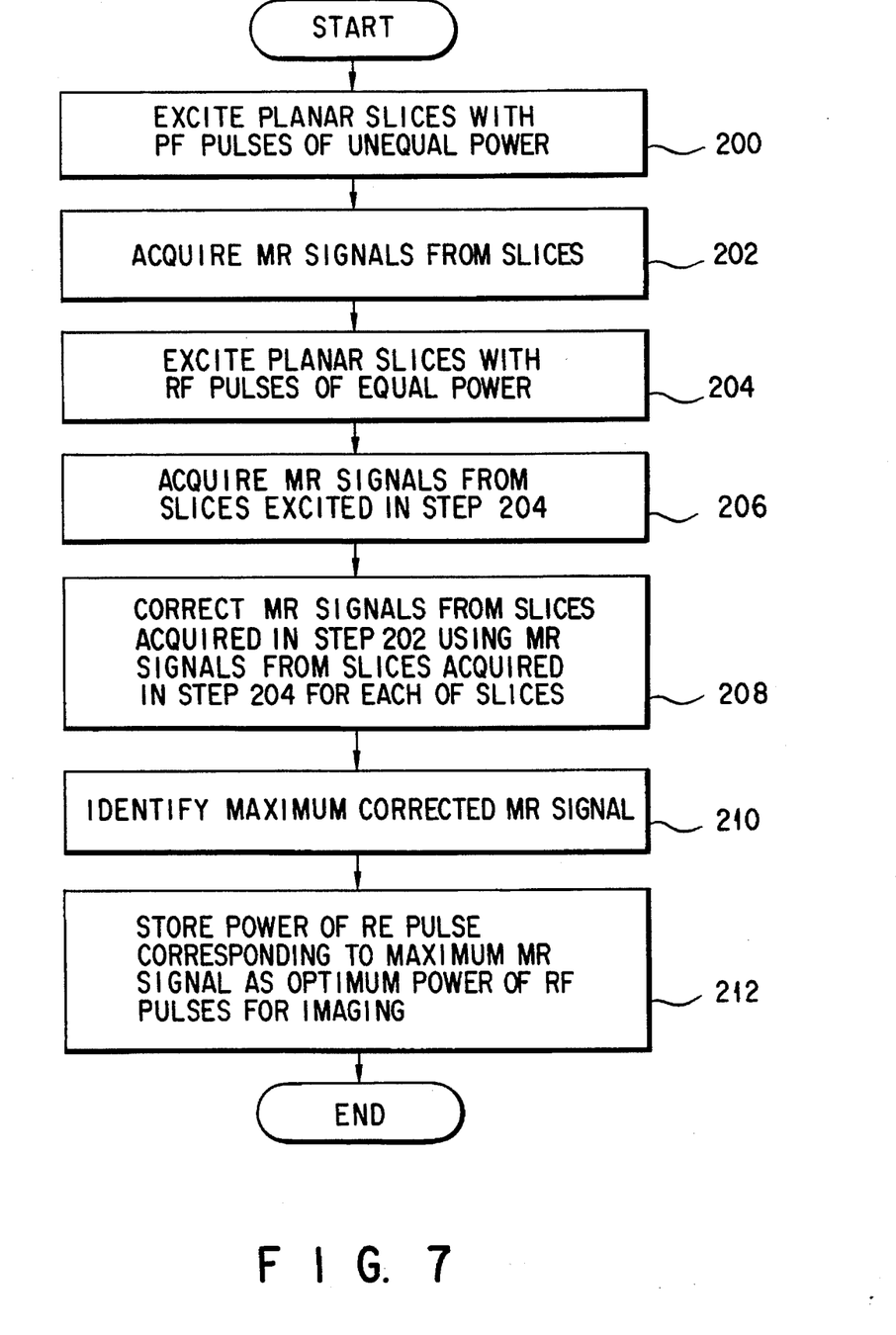
FIG. 7 is a flowchart illustrating the MRI automatic power control shown in FIG. 6.

Next, reference will be made to FIGS. 6 and 7 to describe a technique of obtaining APC data that is suitable for the case where the above assumptions do not hold, for example, where a region to which APC is applied is large (multiple slices of great thickness). The second example is comprised of an APC pre-process and an APC main process. The APC main process is performed after the APC pre-process has been performed. Data Pj obtained by the APC main process is corrected using data Sj obtained by the APC pre-process for each planar slice, thereby obtaining corrected APC data Aj (steps 200 and 203). Note that $1 \leq J \leq n$, n being the number of measured points.

The APC pre-process will be described in detail. MR signals are acquired from the same planar slices as those in the APC main process with the strength of RF pulses kept constant (steps 204 and 206). Consider the strength of each MR signal as a quantity that reflects the spin density in a corresponding planar slice. The above APC data from each slice is divided by a corresponding quantity. That is, let an MR signal value obtained from each planar slice with the strength of RF pulses kept constant be Sj (S1–Sn), and let an MR signal value from each planar slice with the strength of RF pulses varied in steps be Pj (P1–Pn). Then corrected APC data is obtained as Aj=Pj/Sj (step 208). The maximum corrected APC data Aj is identified (step 210). The strength of an RF pulse that provides an MR signal corresponding to the maximum corrected APC data is stored as the optimum RF pulse strength in a memory in the system controller 39 or the computer 40 (step 212). Using RF pulses having the optimum strength, imaging of the excitation region is performed.

Although the preferred embodiments of the present invention have been disclosed and described, it is apparent that other embodiments and modifications are possible. For example, in order to improve accuracy, the optimum set value will be obtained by curve-fitting of a curve drawn by a plurality of MR signals acquired with some function. This will also decrease the number of measured points. Moreover, accuracy will be improved by changing the strength of RF pulses coarsely at first and then finely in the neighborhood of the optimum value. Furthermore, in the case where the number of measured points is decreased by the use of a curve fitting technique, the process of compensating for difference in spin density between planar slices can be omitted by decreasing the thickness of each slice and acquiring MR signals from closer slices for subsequent utilization. Alternatively, increasing the thickness of each slice will improve the signal-to-noise ratio and the accuracy of APC data.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An MRI automatic power control method for imaging a plurality of regions of a subject under examination, comprising:

a first step of exciting each of the plurality of regions of the subject under examination that are close to one another in sequence with excitation radio-frequency pulses of different powers to excite the plurality of regions before passing relaxation time (longitudinal relaxation time) $T_1$ of the regions;

a second step of acquiring magnetic resonance signals from said plurality of regions excited by said first step;

a third step of identifying a maximum magnetic resonance signal contained in said magnetic resonance signals acquired by said second step from said plurality of regions of said subject; and a fourth step of storing the power of an excitation radio-frequency pulse that has provided said maximum magnetic resonance signal identified by said third step as the optimum power of said excitation radio-frequency pulses.

2. The MRI automatic power control method according to claim 1, in which said first step excites a plurality of regions of said subject under examination that are close to one another in sequence with excitation radio-frequency pulses of different powers so as to avoid interference in magnetic resonance phenomenon among said regions and excite said regions before passing relaxation time of said regions.

3. The MRI automatic power control method according to claim 1, in which said first step uses a step of generating excitation radio-frequency pulses of variable strength.

4. An MRI automatic power control method to be adapted to image a plurality of regions of a subject under examination, comprising:

a first step of exciting each of said plurality of regions of said subject under examination that are close to one another in sequence with excitation radio-frequency pulses of different powers so as to perform said excitation of said regions before passing relaxation time (longitudinal relaxation time) $T_1$ of said regions;

a second step of acquiring magnetic resonance signals from said plurality of regions excited by said first step;

a third step of exciting said plurality of regions of said subject with excitation radio-frequency pulses of an equal power;

a fourth step of acquiring magnetic resonance signals from said plurality of regions of said subject excited by said third step;

a fifth step of correcting said magnetic resonance signals acquired by said second step using said magnetic resonance signals acquired by said fourth step for each of said plurality of regions;

a sixth step of identifying a maximum corrected magnetic resonance signal contained in said magnetic resonance signals corrected by said fifth step for each of said plurality of regions; and a seventh step of storing the power of an excitation radio-frequency pulse that has provided said maximum corrected magnetic resonance signal identified by said sixth step as the optimum power of said excitation radio-frequency pulses.

5. The MRI automatic power control method according to claim 4, in which said first step excites a plurality of regions of said subject under examination that are close to one another in sequence with excitation radio-frequency pulses of different powers so as to avoid interference in magnetic resonance phenomenon among said regions and perform said excitations of said regions before passing relaxation time of said regions.

6. The MRI automatic power control method according to claim 4, in which said first step uses a step of generating excitation radio-frequency pulses of variable strength.

7. An MRI automatic power control system for imaging a plurality of regions of a subject under examination, comprising:

first means for exciting each of the plurality of regions of the subject under examination that are close to one another in sequence with excitation radio-frequency pulses of different powers to excite the plurality of regions before passing relaxation time (longitudinal relaxation time) $T_1$ of the regions;

second means for acquiring magnetic resonance signals from said plurality of regions excited by said first means;

third means for identifying a maximum magnetic resonance signal contained in said magnetic resonance signals acquired by said second means from said plurality of regions of said subject; and fourth means for storing the power of an excitation radio-frequency pulse that has provided said maximum magnetic resonance signal identified by said third means as the optimum power of said excitation radio-frequency pulses.

8. The MRS automatic power control system according to claim 7, in which said first means excites a plurality of regions of said subject under examination that are close to one another in sequence with excitation radio-frequency pulses of different powers so as to avoid interference in magnetic resonance phenomenon among said regions and excite the regions before passing relaxation time of the regions.

9. The MRI automatic power control system according to claim 7, in which said first means includes means for generating excitation radio-frequency pulses of variable strength.

10. An MRI automatic power control method to be adapted to image a plurality of regions of a subject under examination, comprising:

first means for exciting each of said plurality of regions of said subject under examination that are close to one another in sequence with excitation radio-frequency pulse of different powers so as to perform said excitations of said regions before passing relaxation time (longitudinal relaxation time) $T_1$ of said regions;

second means for acquiring magnetic resonance signals from said plurality of regions excited by said first means;

third means for exciting said plurality of regions of said subject with excitation radio-frequency pulses of an equal power;

fourth means for acquiring magnetic resonance signals from said plurality of regions of said subject excited by said third means;

fifth means for correcting said magnetic resonance signals acquired by said second means using said magnetic resonance signals acquired by said fourth means for each of said plurality of regions;

sixth means for identifying a maximum corrected magnetic resonance signal contained in said magnetic resonance signals corrected by said fifth means for each of said plurality of regions; and seventh means for storing the power of an excitation radio-frequency pulse that has provided said maximum corrected magnetic resonance signal identified by said sixth means as the optimum power of said excitation radio-frequency pulses.

11. The MRI automatic power control system according to claim 10, in which said first means excites a plurality of regions of said subject under examination that are close to one another in sequence with excitation radio-frequency pulses of different powers so as to avoid interference in magnetic resonance phenomenon among said regions and perform said excitations of said regions before passing relaxation time of said regions.

12. The MRI automatic power control system according to claim 10, in which said first means includes means for generating excitation radio-frequency pulses of variable strength.

* * * * *